United States Patent [19]

Chang et al.

[11] Patent Number: 5,546,321
[45] Date of Patent: Aug. 13, 1996

[54] METHOD AND APPARATUS FOR THE CROSS-SECTIONAL DESIGN OF MULTI-LAYER PRINTED CIRCUIT BOARDS

[75] Inventors: Chi S. Chang, Endicott; Subahu D. Desai, Vestal; Debra A. Gernhart, Johnson City; Phillip A. Hartley, Vestal; Robert J. Haskins, Jr., Endwell; Keith K. T. Ho; Robert A. Martone, both of Endicott; Roy T. Mulcahy, Vestal; Louis J. Shaffer; Robert D. Schoening, both of Endicott; Scott A. Versprille, Vestal, all of N.Y.

[73] Assignee: International Business Machines Corporation, Armonk, N.Y.

[21] Appl. No.: 518,514

[22] Filed: Aug. 23, 1995

Related U.S. Application Data

[63] Continuation of Ser. No. 28,098, Mar. 8, 1993.

[51] Int. Cl.⁶ .................... G06F 17/50; G06F 17/18
[52] U.S. Cl. .............. 364/491; 364/489; 364/488; 395/76; 395/77; 395/921; 395/919
[58] Field of Search ................ 364/488, 489, 364/490, 491, 578; 395/50, 76, 77, 921, 919

[56] References Cited

U.S. PATENT DOCUMENTS

| | | | |
|---|---|---|---|
| 4,437,603 | 3/1984 | Kobayashi et al. | 228/4.5 |
| 4,703,435 | 10/1987 | Darringer et al. | 364/491 |
| 4,768,154 | 8/1988 | Sliwkowski et al. | 364/468 |
| 4,922,432 | 5/1990 | Kobayashi et al. | 364/490 |
| 4,939,680 | 7/1990 | Yoshida | 395/60 |
| 5,197,016 | 3/1993 | Sugimoto et al. | 364/490 |

*Primary Examiner*—Kevin J. Teska
*Assistant Examiner*—Thai Phan
*Attorney, Agent, or Firm*—Richard M. Goldman

[57] ABSTRACT

Disclosed is a design tool and a method of fabricating a multi-layer printed circuit board. The method utilizes the design tool. The knowledge base means has both (1) printed circuit board cross sectional geometric parameter to transmission line parameter data and (2) "IF . . . THEN . . . " production rules for lamination, registration, circuitization, testability, test tools, and test procedures. These tools relate to manufacturability, cost, test development, second level packaging and printed circuit board. The printed circuit board begins with the user entering the printed circuit board design parameters and performance parameters into the input/output interface. Next, the knowledge base production rules are applied to the printed circuit board design and performance parameters to generate a set of cross section designs meeting the user specified parameters. The printed circuit board is then built up in accordance with one of the generated cross section designs.

2 Claims, 8 Drawing Sheets

METHOD AND APPARATUS FOR THE CROSS-SECTIONAL DESIGN OF MULTI-LAYER PRINTED CIRCUIT BOARDS

CROSS REFERENCE TO RELATED APPLICATION

This is a continuation application of commonly assigned, copending U.S. application Ser. No. 08/028,098, filed Mar. 3, 1993.

FIELD OF THE INVENTION

This invention relates to the manufacture of printed circuit boards (PCB's). More specifically, this invention relates to methods for the design and manufacture of printed circuit boards utilizing expert system based design tools and quality control test development tools, to the tools, and to the use of the tools in combination.

The expert systems for both the design tool and the test development tool utilize knowledge bases for reliability, cost, electrical design, manufacturability, and quality levels.

BACKGROUND OF THE INVENTION

Printed Circuit Board Design Complexity

The present design methodology for printed circuit board cross sections is a sequential process. In the sequential design process the customer specifications are an initial input to the design process. The initial design derived from the customer specifications is then subjected to a cost engineering analysis, a reliability analysis, and a manufacturability analysis. These are sequential steps, each one coming after completion of the preceding step. Moreover, after this initial stage of design is completed, the resulting preliminary design is reviewed for design of the quality control test sequence. The total design sequence is a time consuming, highly iterative, multi-step process. Thus there is a clear need for a concurrent method of printed circuit board cross section design.

BACKGROUND OF THE INVENTION

Expert Systems

One method of providing concurrency in heretofore sequential process is through the use of expert systems. As described in E. A. Feigenbaum & P. McCorduck, *The Fifth Generation,* "An expert system is an intelligent computer program that uses knowledge and inference procedures to solve problems. The knowledge of an expert system consists of facts and heuristics. The "facts" constitute a body of information that is widely shared, publicly available, and generally agreed upon by experts in the field. The "heuristics" are mostly private, little discussed rules of good judgement that characterize expert-level decision making in the field."

As described by L. L. Snyder and Wayne K. Schmidt in "Software Review PC Tools for Expert System Development," *Computers In Human Behavior,* Vol. 8, pp. 273–278 (1992), "An expert system is a computer program that contains the domain-specific knowledge of a human expert, encoded in a form that can be accessed by other humans for assistance in problem solving and task performance."

The task domain of expert systems is characterized by (i) complexity, (ii) specification, (iii) expertise, and (iv) judgement. Expert systems are applied to complex systems and complex tasks, such as product planning, process design, scheduling, and diagnosing.

Expert systems perform tasks that require a particular type and amount of expertise. Expertise, represented within the knowledge base, is a body of knowledge in a particular area or domain, and the ability to draw conclusions from this knowledge.

Expert systems provide judgmental decision making. An expert system uses the knowledge base and the rules contained in the knowledge base to arrive at conclusions and recommendations which require judgements on the part of the decision maker.

Expert systems are used in the design engineering process to reduce the number of design and prototyping iterations. One reason why many iterations of design and prototyping are needed before a satisfactory, high quality design is reached is the difficulty in communications between designers and production engineers.

Another reason for multiple iterations is the functional complexity of modern technology products. The complexity of many products limits the ability to calculate and predict the functionality of the product before it has been constructed.

Combined with design complexity is the fact that the institutional knowledge and experience of an organization, i.e, its oral history and the oral history of its products, is built up by and resides in its people rather than in organization itself. This means a loss of experience when people leave the organization. One consequence is that expertise, which has been built over a long period of time, regarding the development of specific products and the parts thereof, as well as the factors influencing the quality of these products and the individual parts thereof, is present only in the minds of the developers and other people in the organization.

The information flow in building and subsequently using an expert system is illustrated in FIG. 1. An expert system collects and retains this knowledge. In an expert system the domain specific knowledge of the individuals, is collected and stored in a form that can be accessed and added to by other members of the organization. The domain specific knowledge is obtained from humans and/or other data bases and entered into the expert system through an "Acquisition Module." The "Acquisition Module" can be a structured set of questions based on answers already provided, mathematical models, etc. Alternatively, the "Acquisition Module" can be a CAD or CAE tool, providing design parameter inputs.

The knowledge obtained from the Acquisition Module is stored in a knowledge base, typically in the form of Production Rules, i.e., "IF . . . THEN . . . " rules, and in the form of Frames, i.e., scenarios. The accumulated human knowledge residing in the knowledge base in a machine accessible form is accessed by and subjected to analysis in an inference engine. The Inference Engine draws inferences based on the available information, i.e., the contents of the knowledge base, and the user inputs.

Turning specifically to the knowledge base, the knowledge base is the source of facts and knowledge associated with a domain or an area of application. The knowledge base contains general information as well as heuristic and judgmental knowledge, including problem solving rules, about the problem domain. It is typically built by a knowledge engineer using a question method to acquire the knowledge need to perform the assigned task. In the knowledge base the knowledge is represented in a form that can be used by automated code. This machine accessible form can be either semantic networks or production rules.

The most common knowledge base is a rule repository, which utilizes isolated rules. Rule isolation allows rules to be subsequently changed, modified, and updated. A rule represents one or more conditions of a particular item of knowledge; if the rule requirements are met, it will lead to action. The most common rules used in knowledge representation are production rules of the "if . . . then . . . " type. "If . . . then . . . " production rules capture information in an explicit form, which is easily understood and verified by end-users. "If . . . then . . . " production rules are the knowledge representation method of choice for heuristic systems.

Typically, the knowledge base contains product structures, control structures, and plausibility of knowledge quality qualifiers. In the product structure portion of the knowledge base, the product is described in terms of geometry, . . . functionality, features, attributes of the features, and conflict avoiding attributes. The control structures control the inference process. Finally, the quality qualifiers characterize the quality of the data and the information, and of the reasoning mechanism. This is a content plausibility check.

The knowledge base rules, interacting with the user inputs through the inference engine, provide the operating context of the expert system. The context can be thought of as a buffer where the present state of interaction is captured and represented.

The inference engine is the heart of the typical expert system. FIG. 2 illustrates the inference engine and control mechanism between the user interface and the knowledge base. The reasoning of the expert system resides in the inference engine. The inference engine is the mechanism for utilizing the knowledge stored in the knowledge base. That is, the inference engine is the control mechanism of the expert system, using the knowledge database and the global database to arrive at conclusions for a user. The inference engine uses heuristic search methods, string comparisons, and symbolic processing, vice numeric and algorithmic search methods. Because of heuristics and symbol manipulation expert systems are able to solve complex and ill-defined problems that involve qualitative factors.

In what is referred to as the "backward mode" of operation the expert system begins by searching for qualified designs, that is for successful designs of the past with matching customer requirements and specifications. The customer requirements entered by the design engineer are the starting point. The Expert System begins its search by first searching for previously qualified designs meeting the same customer requirements.

The Expert System could also do a consistency check, that is, a sanity or validity check. In this step the Expert System checks the customer's requirements for contradictory requirements. This is then followed by applying inferencing to the manufacturability database.

In a some Expert Systems there is also a prediction of product quality. This prediction is carried out by matching the customer's quality characteristics to the capabilities of the manufacturing processes and equipment.

There are two processing strategies for inference engines, forward chaining and backward chaining.

In forward chaining, also called "bottom-up processing," the system begins with the facts and looks for the best conclusion. Forward chaining is data driven. Forward chaining may be considered as a search strategy in which the inference engine searches the tree matching the left sides ("IF . . . ") of the production rules to generate successive levels of nodes until a configuration that matches the goal is found.

By way of contrast, in backward chaining, also called "top-down processing," the expert system begins with a hypothesis, an works backward to see if the facts support the hypothesis. Backward chaining is goal driven. In backward chaining the search starts by building a tree of move sequences with the goal configurations (states) at the root of the tree. The subsequent levels of configurations or nodes are generated by finding all of the rules whose right side ("THEN . . . ") matches that of the preceding states, until a configuration that matches the initial state is generated.

Both backward chaining and forward chaining use similar search strategies. Search strategies include the depth-first search and the breadth-first search.

In the depth-first search strategy the system examines successively all of the nodes of a path until a goal or dead end is found, and then jumps to a different path. In the breadth-first search strategy the system examines all of the nodes at a first level, and then all of the nodes at a subsequent level.

The production rules can be represented by nodes, and the inference engine strategy by directed line segments between nodes as illustrated in FIGS. 3, 4, and 5. In FIG. 3 a node is shown, with its node number, object, parameter or value, and flag. Examples of the production rule nodes, and the linking of the nodes in the Inference engine are shown in FIGS. 4 and 5.

In an expert system uncertainty, i.e., statements containing "probably," "generally," "usually" and the like, can be dealt with by one or more of confidence factors, and fuzzy logic.

Expert systems are not algorithmic, numeric processors. On the contrary, they differ from conventional numerical algorithms. Expert systems manipulate "knowledge" in the form of, e.g., character strings, rather then "data." Expert systems can use either or both of algorithms and heuristics to manipulate "knowledge." Furthermore, expert systems can use inferential processes, rather then the repetitive processes of numerical processing.

Specification of solution set search space is required in order to make effective use of an expert system. This is because the size of the search space increases with the number of potential solutions to a problem. The search space is a conceptual or formal area defined by all of the possible states that could occur as a result of the interactions between the elements and operators that are considered when a particular problem is studied.

BACKGROUND OF THE INVENTION

Expert Systems in Quality Management

Quality control is the process of detecting non-conforming parts (i.e., products not meeting standards defined by the customer) in production lots that contain both conforming and non-conforming product. Statistical quality control is the application of statistical methods, including control charts and sampling plans, to determine whether the "quality" of the products meets the customer's specifications. Central-to statistical quality control is the sampling plan. Sampling plans are statistical methods, designed to determine sample size and decision criteria for production lots with different size and "quality." Application of an appropriate sampling plan will result in a sufficient and necessary sample size to estimate lot quality. The estimate of lot quality determines acceptance or rejection of the lot.

A considerable portion of a quality control manager's time is spent in routine and complex decision making processes relating to the quality control methods and the sampling plans. These decision making processes have significant impact on the quality control methods and the sampling plan, which in turn impact the average product quality, the quality improvement, and quality cost. The quality control manager must decide among various statistical process control methods and sampling plans for each part, and for each attribute of the part. Inputs to the quality control manager's decision include the criticality of the part to the overall system, the criticality of the attribute to the part and system, and historical (and expert) information about the part and the attribute.

The quality control manager can utilize an expert system to identify and quantify the potential anomalies that may be present in a given article based on (a limited amount) of easily obtainable information about the article. The quality control manager can use this intermediate output to select the inspection techniques and tools that should be utilized to detect these anomalies, including reliability of the product being tested (i.e., a printed circuit board) as a function of the test sequence used being used, amd time. It should be noted that each test has its own efficiency in finding particular defect types.

One way of building the knowledge base for total quality management is by "What if" analysis of the product design. One such "What if" design analysis tool is failure mode and effect analysis (FMEA). FMEA is a structured way of approaching design analysis. In FMEA failure modes are ranked by:

1. Occurrence Level, from remote to certain.
2. Severity, from no effect on performance to extremely serious effect on performance (including personal injury or death),
3. Detection Rating (from certain detection during manufacture to not detectable by user when in use).

BACKGROUND OF THE INVENTION

Requirements for Printed Circuit Board Cross Sections

The cross section design of printed circuit boards, and the design of the quality control test plan for such printed circuit boards requires the concurrent inputs of many experts. Similarly, the design of the quality control test program for the printed circuit board requires many inputs from many of the same experts. Thus there is a clear need for an expert system to both design the cross section of a Printed circuit board and to design the quality control test Program for the Printed circuit board.

The use of Expert Systems in quality management of printed circuit boards is discussed in the following U.S. patents: U.S. Pat. No. 4,907,230 to Heller et al, for *Apparatus and Method for Testing Printed Circuit Boards and Their Components* describes an expert system for recording and analyzing test result data and for subsequently using the test data to generate further tests. The test programming directs the test instrumentation to perform functional testing while the components are in circuit. Thus, in-circuit parameters are tested.

U.S. Pat. No. 4,176,780 to Sacher et al. for *Method and Apparatus for Testing Printed Circuit Boards* describes a method for using a test program for printed circuit boards, and for modifying the test program if it does not adequately test the board for which it was designed. The software optimizes the test plan and the quality and reliability of the product.

U.S. Pat. No. 4,841,456 to Hogan et al. for *Test System and Method Using Artificial Intelligence Control* describes an automated test system and an AI work station interface for processing the Functional Test Procedures (FTP) data set when the FTP indicates that a failure has occurred. The software identifies the defective unit under test that may have caused the failure, producing data output that identifies the defective portion under test.

The following papers have general background information about Expert Systems:

Crossfield, R. T. & B. G. Dale, "The Use of Expert Systems In Total Quality Management: An Overview," *Qual. Reliab. Eng. Int. (UK)*, Vol. 7, (1), pp. 19–26, January–February 1991.

Fard, Nasser S. & I. Sabuncuoglu, "An Expert System For Selecting Attribute Sampling Plans," *Int'l Jnl Computer Integrated Manufacturing*, (1990), Vol. 3 (6), pp. 364–372.

Gomes, Enio, and Sridahr Kota, "A Knowledge Representation Scheme for Non-Destructive Testing of Composite Components," SP-812, *Polymer Composites For Structural Automotive Applications (SAE)*, International Congress & Exposition, Detroit, Mich., Feb. 26–Mar. 2, 1990.

Hosseini, J., and N. Fard, "Conceptualization and Formalization of Knowledge In A Knowledge Based Quality Assurance System," *Proceedings of the Third International Conference, Expert Systems and the Leading Edge in Production and Operations Management*, 1989, Hilton Head Island, S.C., pp. 333–341.

Kathawala, Y., "Expert Systems: Implications For Operations Management," *Ind. Management & Data Systems (UK)*, Vol. 90, (6), pp. 12–16 (1990)

Owen, B. D., "An Expert System To Aid Quality Planning," *Fourth International Conference On Computer Aided Production Engineering*, 1988, pp. 529–534

With, I., Irgens, C., and H. Goedman, "Knowledge-Based Support Of Quality In Design," *Computer Integrated Manufacturing, Proceedings of the Sixth CIM Europe Annual Conference* 1990, Lisbon, Portugal, May 15–17, 1990, pp. 245–258, Computer Resources, Int, A/S Birkerod, Denmark, Springer-Verlag.

SUMMARY OF THE INVENTION

The printed circuit board cross sectional design method and tool of the invention is a concurrent engineering design method and tool. By a concurrent method and tool is meant that design, reliability, cost, and manufacturability, as well as testability, are approached simultaneously. Concurrent Engineering provides faster cycle times, and a real life time frame for the design process.

According to the method and design tool of the invention, design parameters, such as manufacturability, the number of dielectric plies, the ply type, line spacing, line width, Cu thickness, the number of lines/channel, cost, the intrinsic failure rate, the shipped product quality level, the total printed circuit board cross sectional thickness are related through the knowledge base and the manufacturability inference engine to determine the set of optimal designs.

The user inputs to the tool, including the Manufacturability Inference Engine, include the anticipated application of the printed circuit board, the number of through holes, vias, and blind vias, the limits on the wiring grids, the linear inches of Cu/ply, and the linear inches of Cu/package. These inputs are subjected to the Manufacturability Inference Engine and the Knowledge Base to allow "What If" analysis. Exemplary "What If" analysis includes varying the line width and line spacing between low and high wiring density, and consequently between different wiring processes, as additive and subtractive circuitization.

This is accomplished by an expert system having a Manufacturability Inference Engine and a Knowledge Base, or a set of Knowledge Bases, as illustrated in FIG. 6. The Concurrent Design Engineering Tool there illustrated is a manufacturability expert system with at least five manufacturability related knowledge bases: manufacturability, cost, test development, second level packaging, and printed circuit board knowledge bases.

The knowledge base utilized in the method and tool of the invention is a production rule type knowledge base, that is, it has knowledge in the form of "IF . . . THEN . . . " rules. These production rules are, inter alia, the manufacturability rules, such as "If there are more then n plies . . . then the design is unsatisfactory because . . . " and "If there are less then n plies . . . then the design is unsatisfactory because . . . . " The stored production rules accumulate stored human experience in at least the areas of lamination, registration, circuitization, testability, and test tools and procedures.

The output of the cross section design tool and method may be direct input to the direct, point to point wiring CAD tool. Alternatively, the output of the cross sectional design tool can be an input to a test sequence design tool. The test sequence design tool arrays test sequences and build levels.

The tool and method of the invention start from the designer's best estimate of the number of layers, numbers of signal and power planes, and rough layout and give the designer a set of printed circuit board cross sections. The designer can then select, combine, and modify the cross sections to accommodate the chip or chips and match the impedances. In the backward mode the tool searches for existing qualified products, and also creates new designs. It works backward, then forward, then backward to tweak present the alternatives, which may be in a rank order, to the designer.

THE FIGURES

The invention may be understood by reference to the FIGURES appended hereto.

FIG. 1, denominated "Prior Art," shows the flow of information in an Expert System, from the expert and external data bases, through the Acquisition Module, into the knowledge Base, where it is operated-on by the Inference Engine, and presented to the user through the User Interface.

FIG. 2, denominated "Prior Art," illustrates the Inference Engine between the User Interface and the Knowledge Base.

FIGS. 3, 4, and 5, all denominated "Prior Art," illustrates the Inference Engine and the Knowledge Base, with the Knowledge Base rules shown as nodes, illustrated with specificity in FIG. 3, and the directed line segments linking the nodes in FIGS. 4 and 5.

FIG. 3, denominated "Prior Art," illustrates a knowledge base rule, represented as a node.

FIG. 4, denominated "Prior Art," illustrates the relationship between three "IF . . . THEN . . . " Production Rule Nodes.

FIG. 5, denominated "Prior Art," illustrates the relationship between chained nodes.

DETAILED DESCRIPTION OF THE INVENTION

Figure 1:
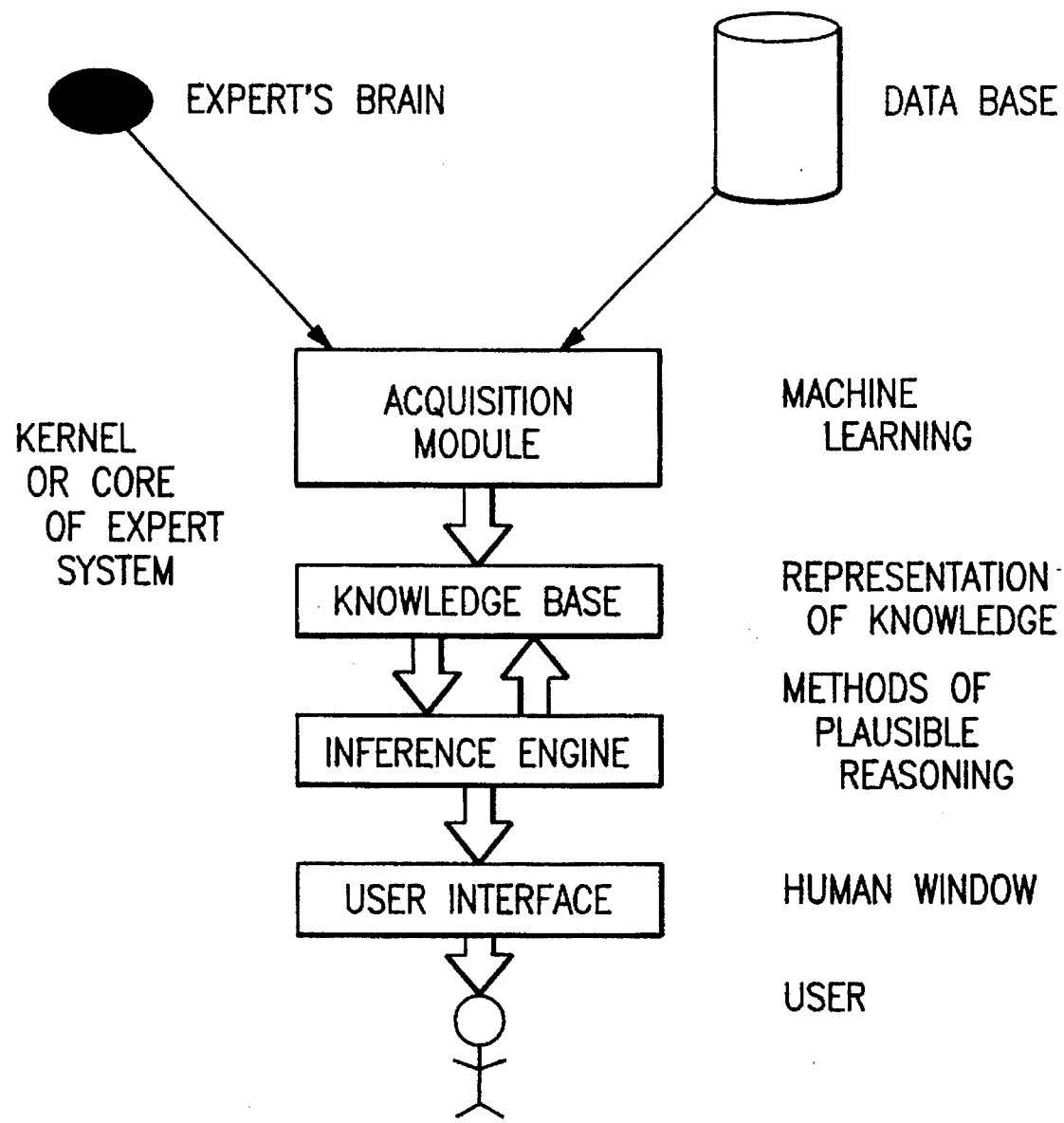
Figure 2:
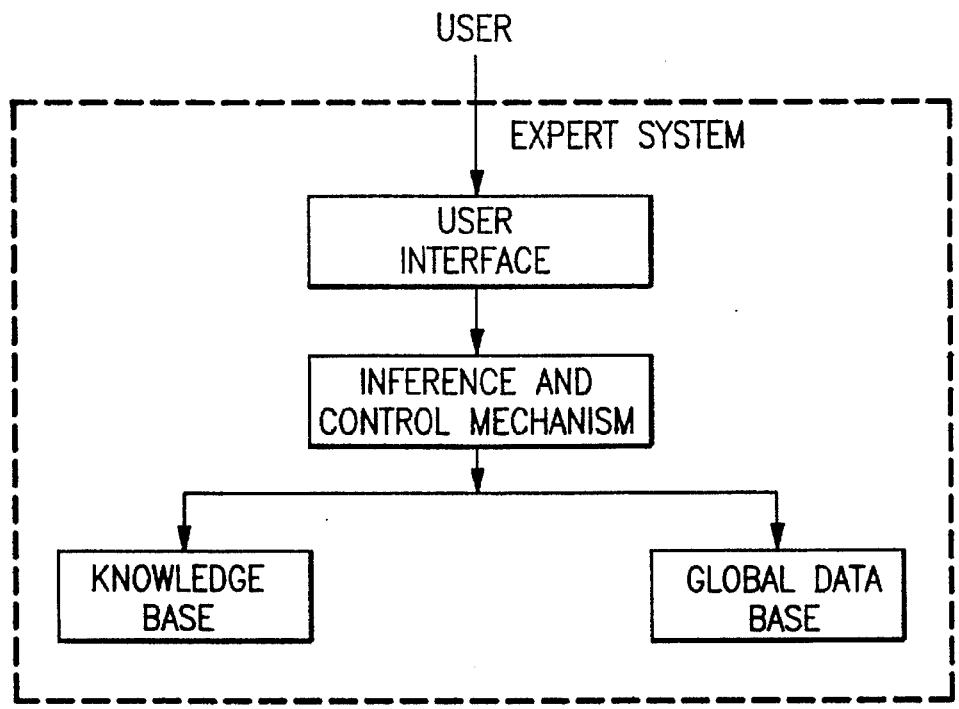
Figure 3:
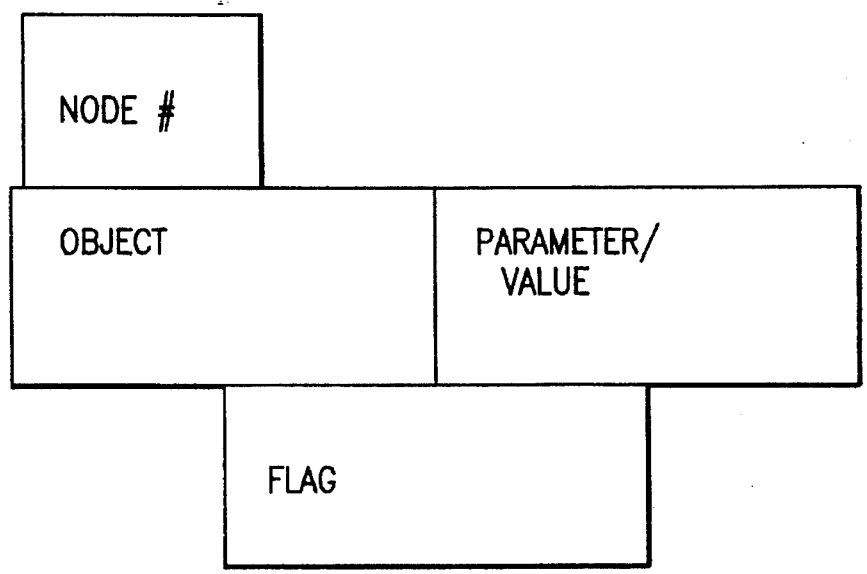
Figure 4:
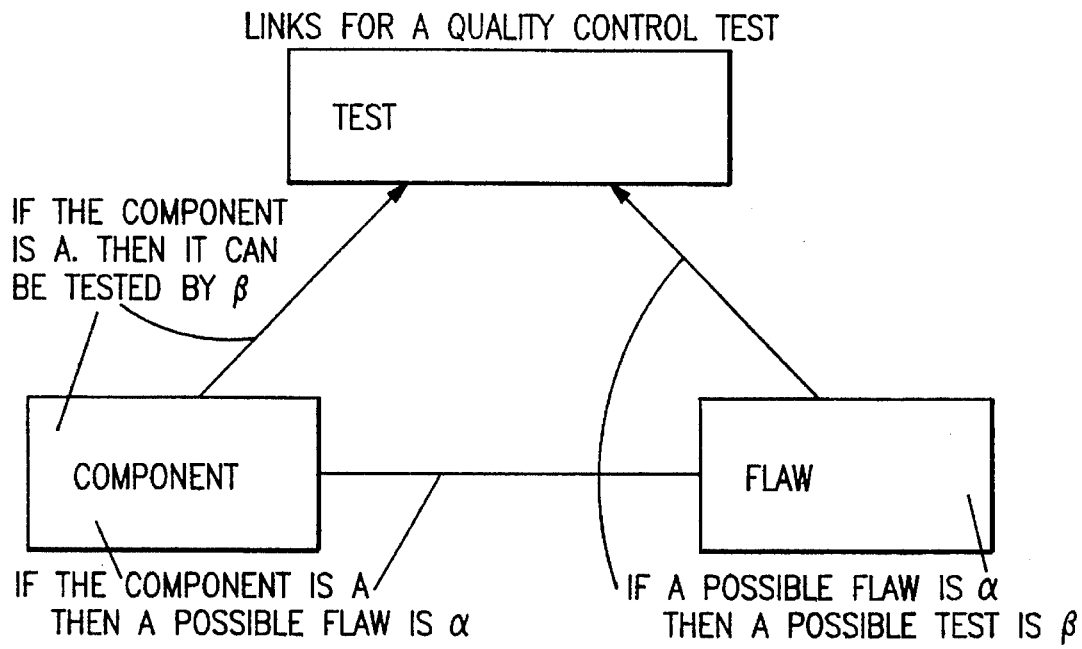
Figure 5:
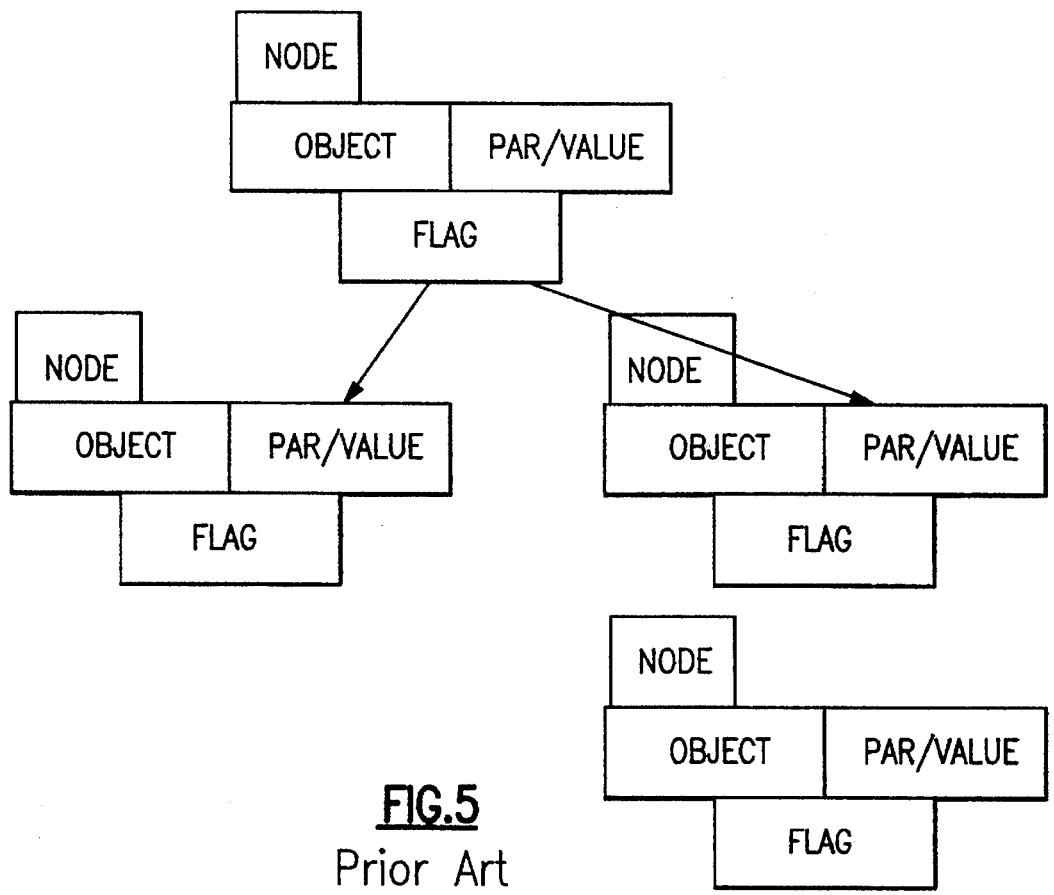
Figure 6:
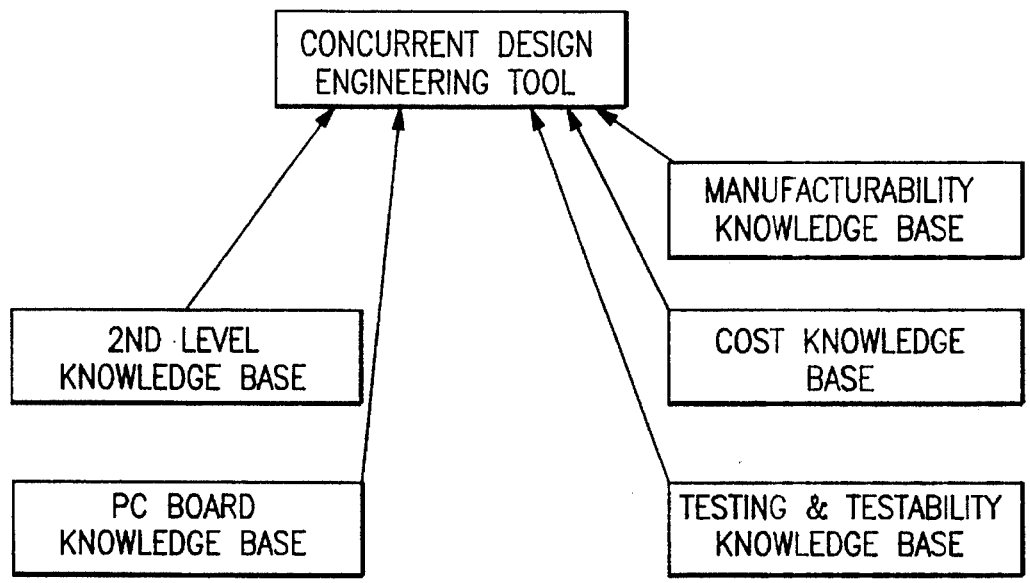
FIG. 6 illustrates a manufacturability expert system with at least five manufacturability related knowledge bases: manufacturability, cost, test development, second level packaging, and printed circuit board knowledge bases.

The invention relates to a method of designing multilayer printed circuit boards (PCB's), and more particularly to a method of designing the cross sections of printed circuit boards, i.e., the number of layers, signal planes, power planes, and ground planes, the thicknesses thereof, the line widths and pitches, and spacing between conducting planes, e.g., between signal planes, signal plane to ground plane spacing, signal plane to power plane spacing, and ground plane to power plane spacing. The output of the cross section design method and tool is then utilized as the input to a point to point wiring design process, e.g, a CAD design process.

The process and the tool are based on an expert system based design tool for printed circuit board (PCB) cross sections. The tool and method integrate the electrical performance factors, cost factors, reliability factors, and manufacturability factors. These factors have heretofore resided in the skill and experience of individual engineers spread across one or more organizations. According to the tool and method of this invention this discrete knowledge is integrated into an Expert System knowledge base.

The method and tool of the invention allow a design engineer to draw upon the accumulated knowledge of many individual experts in order to quickly evaluate a plurality of design alternatives in terms of technology, performance, and cost tradeoffs. In the forward mode the design engineer can evaluate alternatives using "what if" analysis with any design parameter, and observe the ripple effect of the change in one or more design parameters on all other parameters. In the backward mode, the design engineer specifies the performance objectives, and the tool and method of the invention recommends the design alternatives to satisfy the performance objectives.

In forward mode operation, utilizing a graphical user interface, the method and tool of the invention display a PCB cross section, and the user is allowed to vary input parameters for "what if" analysis.

The tool and method of this invention speed up the printed circuit board design process, and optimizes the product design in terms of electrical performance, cost, reliability, and manufacturability. The tool and system of the invention speed up the design cycle, allowing same day response time. This reduces the total development time, and optimizes the printed circuit board design for manufacturability. Moreover, the design tool and method of the invention allows concurrent consideration of reliability, manufacturability, and cost early in the design process.

Problem Domain of the Design Tool and Method

The system designs a printed circuit board (PCB) cross section consisting of signal lines, power planes, and ground planes in a homogeneous (or distributed parameter) insulation material. Chips are represented conventionally as capacitive loads on the signal lines. Operation of the chips, whether memory, logic, or even I/O, depends upon the signal line impedance, the matched load impedance, the signal propagation delay, the chip capacitive delay, and the signal line combinations and permutations.

As is well known in the transmission line art, the common and difference modes of signal and address lines result in a maximum (tc) propagation time, and a minimum (td) propagation time. In general, (1−td/tc) is between 0 and 0.15.

The signal propagation time is proportional to the square root of the dielectric constant of the medium if the signal line is inactive (i.e., not connected to a chip). Moreover, the signal propagation time slows down with an increasing number of chips, which also causes the difference between the maximum signal propagation time, $t_c$, and the minimum signal propagation time, $t_d$. This causes the factor $1-t_d/t_c$ to drift away from 0. A competing effect is that the signal cross talk will be lower since the capacitive coupling is inversely proportional to the sum of the signal line capacitance and the chip capacitative loading. This causes the factor $V_{min}/V_{max}$ to be closer to 1.

Figure 7:
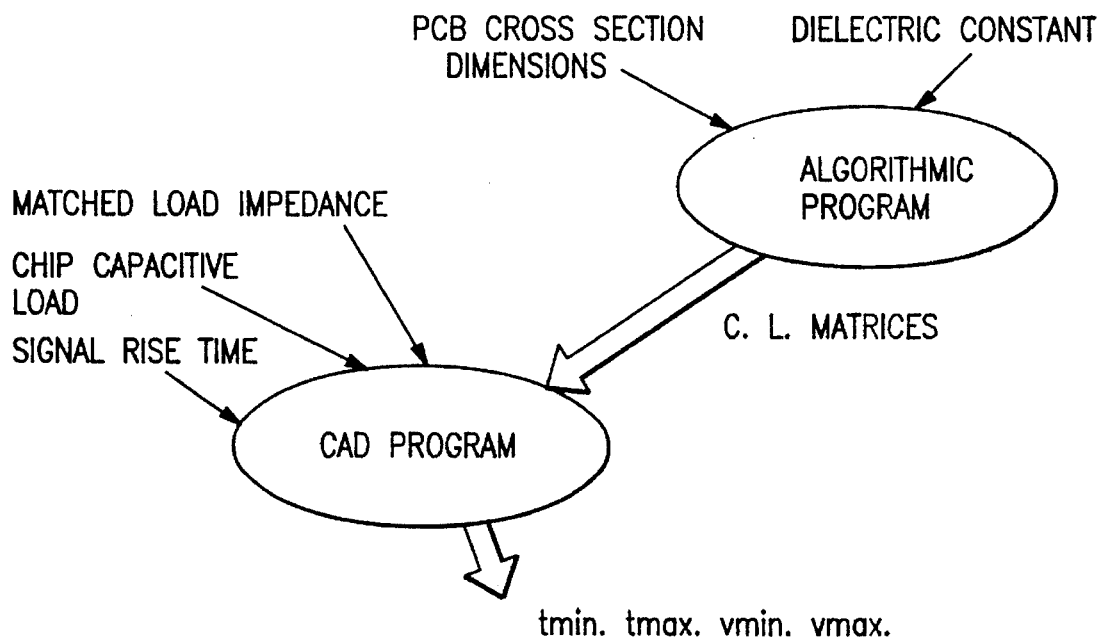
FIG. 7 illustrates a CAD program that can be used in conjunction with the tool and method of the invention to numerically compute the capacitance, C, and inductance, L, matrices from the user's inputs. These parameters are then used to simulate the operation of the printed circuit board.

These quantification of the interactions of these electrical parameters to yield a design are the critical factors in printed circuit board design. This can be done by a conventional algorithmic design tool, e.g., as shown in FIG. 7. The CAD program numerically computes the capacitance, C, and inductance, L, matrices from the user's inputs. This is then used to simulate the operation of the populated and active printed circuit board. To be noted is that the algorithmic program and the simulation program require complex software necessitating a high degree of user interaction. Each candidate solution, i.e., Printed Circuit Board Cross Section Dimensions, must be individually entered. This effectively reduces the size of the set of candidate solutions considered by the design engineer.

By way of contrast, the Manufacturability Expert System of the invention directly uses neither the CAD tool nor the simulation tool. Instead, the expert system takes the user's inputs and applies a curve fitting technique to project the electrical parameters of the cross section. The fitting algorithm is a conventional, systematic study of the triplate structure shown in the Figures. This algorithm is applied over a broad range of printed circuit board cross sections. The algorithm provides an estimate of the signal line impedance, the matched line impedance, and the cross talk at the near end of the center line within +/−3% of the numerically computed values. These values are adequate for a first approximate to compare candidate structures.

The expert system includes at least three components, (1) an input/output management or I/O system, (2) curve fitting algorithms that calculate the electrical parameters of the printed circuit board cross section, and (3) the inferencing engine. Optionally, the expert system contains knowledge matrices representing the relationships between the inputs and the outputs.

Input/Output System

The input/output system provides a user interface, for example a graphical user interface, between the user and the expert system. The user enters the design requirements, e.g., design goals, candidate printed circuit board cross sections, chip capacitance loading, chip loading, and the like. The interface output displays and compares printed circuit board cross sections, and concomitant design parameters, e.g., signal line impedance, cross talk, and the like.

Curve Fitting Algorithms

The curve fitting algorithm calculates the electrical parameters of a printed circuit board cross section from the user's inputs. The curve fitting algorithm is subject to the restrictions of the knowledge base or knowledge matrix.

Knowledge Matrices

Figure 10:
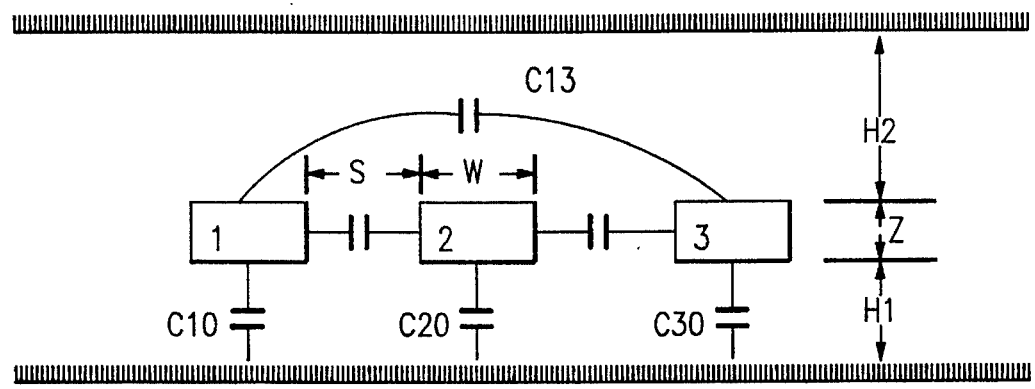
FIG. 10 is a cross sectional view of a triplate structure used to illustrate the action of the inference engine on the knowledge bases.
Figure 11:
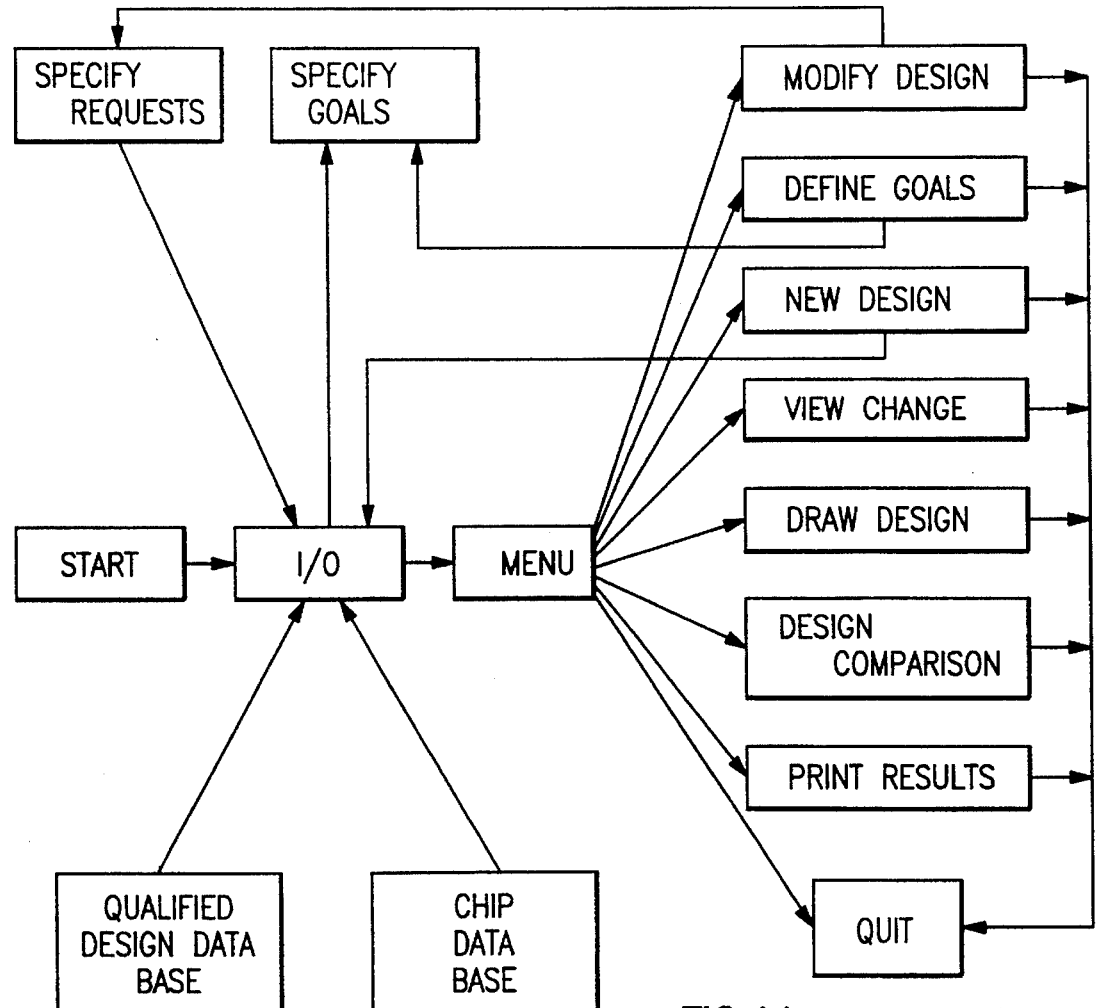
FIG. 11 is a flow chart and structure chart of the expert system of the method and tool of the invention.

The knowledge matrices represent the relationships between the input and output variables. Knowledge matrices for a triplate structure having the cross sectional structure shown in FIG. 10 are shown in the Tables below. Table I is for an unpopulated triplate. Table II is for a populated triplate. In all cases the dimensions refer to FIG. 10.

TABLE I

| | KNOWLEDGE MATRIX FOR AN UNPOPULATED TRIPLATE | | | | |
|---|---|---|---|---|---|
| | Y1 | Y2 | Y3 | Y4 | Y5 |
| X1 ↑ | ↑ | ↑ | ↑ | — | — |
| X1 ↓ | ↓ | ↓ | ↓ | — | — |
| X2 ↑ | ↑ | ↑ | ↑ | — | — |
| X2 ↓ | ↓ | ↓ | ↓ | — | — |
| X3 ↑ | ↓ | ↓ | ↓ | ↓ | — |
| X3 ↓ | ↑ | ↑ | ↑ | ↑ | — |
| X4 ↑ | ↑ | ↓ | ↓ | ↓ | — |
| X4 ↓ | ↓ | ↑ | ↑ | ↑ | — |
| X5 ↑ | ↓ | — | ↑ | — | — |
| X5 ↓ | ↑ | — | ↓ | — | — |
| X6 ↑ | — | ↓ | ↓ | — | ↑ |
| X6 ↓ | — | ↑ | ↑ | — | ↓ | where
X1 = Space between ground planes (H) (mils);
X2 = Space between signal line and bottom ground plane (h) (mils);
X3 = Signal line width (W) (mils);
X4 = Signal line thickness (mils);
X5 = Space (S) between two adjacent signal lines (mils);
X6 = Dielectric constant, , of the dielectric.
Y1 = Saturated near-end coupled noise, AQA (mV/V);
Y2 = Characteristic impedance of one signal line alone (Ω);
Y3 = Matched load impedance (Ω);
Y4 = DC resistance (Ω/inch); and
Y5 = Signal propagation time (ns/inch).

The knowledge matrix when the signal lines are connected to memory chips is as shown below:

TABLE II

KNOWLEDGE MATRIX FOR A POPULATED TRIPLATE

| | Y1 | Y2 | Y3 | Y4 | Y5 | Y6 | Y7 | Y8 |
|---|---|---|---|---|---|---|---|---|
| X1↑ | ↑ | ↓ | ↑ | ↑ | — | ↑ | ↓ | ↑ |
| X1↓ | ↓ | ↑ | ↓ | ↓ | — | ↓ | ↑ | ↓ |
| X2↑ | ↑ | ↓ | ↑ | ↑ | — | ↑ | ↓ | ↑ |
| X2↓ | ↓ | ↑ | ↓ | ↓ | — | ↓ | ↑ | ↓ |
| X3↑ | ↓ | ↑ | ↓ | ↓ | — | ↓ | ↓ | ↓ |
| X3↓ | ↑ | ↓ | ↑ | ↑ | — | ↑ | ↑ | ↑ |
| X4↑ | ↑ | ↓ | ↓ | ↓ | — | ↓ | ↓ | ↑ |
| X4↓ | ↓ | ↑ | ↑ | ↑ | — | ↑ | ↑ | ↓ |
| X5↑ | ↑ | ↓ | ↓ | ↓ | — | ↓ | ↓ | ↑ |
| X5↓ | ↓ | ↑ | ↑ | ↑ | — | ↑ | ↑ | ↓ |
| X6↑ | ↑ | ↓ | ↓ | ↓ | ↑ | ↑ | ↑ | ↓ |
| X6↓ | ↓ | ↑ | ↑ | ↑ | ↓ | ↓ | ↓ | ↑ |
| X7↑ | ↓ | ↑ | — | ↓ | — | ↑ | ↑ | ↑ |
| X7↓ | ↑ | ↑ | — | ↑ | — | ↓ | ↓ | ↓ |
| X8↑ | ↑ | ↓ | — | ↑ | — | ↓ | ↓ | ↓ |
| X8↓ | ↓ | ↑ | — | ↓ | — | ↑ | ↑ | ↓ | where
X1 = Space between ground planes (H) (mils);
X2 = Space between signal line and bottom ground plane (h) (mils);
X3 = Signal line width (W) (mils);
X4 = Signal line thickness (mils);
X5 = Space (S) between two adjacent signal lines (mils);
X6 = Dielectric constant, $\epsilon$, of the dielectric;
X7 = Total chip capacitive loading (pf);
X8 = Signal line length (in);
Y1 = Saturated near-end coupled noise, AQA (mV/V);
Y2 = $V_{min}/V_{max}$;
Y3 = Characteristic impedance of one signal line alone ($\Omega$);
Y4 = Desired output impedance of the driver ($\Omega$);
Y5 = Signal propagation time, no-load (ns/inch);
Y6 = Common mode propagation time, $t_c$ (ns/inch);
Y7 = Difference mode propagation time, $t_d$ (ns/inch); and
Y8 = 1 – $t_d/t_c$.

In addition to the knowledge matrices, the expert system includes heuristics and rules of thumb, such as maintaining the characteristic impedance of a signal line between 50$\Omega$ and 80$\Omega$.

Heuristically Derived Data Bases

An extensive heuristically derived data base is also used in the system of the invention. This data base relates line impedances and capacitances to geomrtric factors. The data base builds on the observation that a printed circuit board cross section is electrically characterized by three electrical parameters. They are:

1. Characteristic impedance of the signal line;
2. Matched load impedance; and
3. Cross talk between a pair of adjacent signal lines.

These parameters can be obtained by numerical integration. Frequently many iterations are required and the numerical solutions are non-trivial. However, in our expert system we utilize a data base for the characteristic impedance, matched load impedance, and cross talk. The inputs to the data base are the printed circuit board physical dimensions or simple functions thereof. The values are obtained by regression analysis of the transmission lines equations, and stored in the data base as functions of the printed circuit board geometry.

Starting from an isolated signal line in a homogeneous dielectric medium (i.e., a strip line), the electrostatic capacitance is calculated using the method of W. T. Weeks, "Calculation of Coefficients of Capacitance of Multiconductor Transmission Lines In The Presence of A Dielectric Interface," *IEEE Trans. Microwave Theory Tech.*, MTT-18, pp. 35–43 (1970), incorporated herein by reference. Utilizing the value of electrostatic impedance obtained thereby, the characteristic impedance is derived as:

$$Z_o = \tau C^{-1} \text{ (ohms)}$$

where $$\tau = 3.33 \sqrt{\epsilon_r} \text{ (pico seconds/millimeter)}.$$

$\tau$ is the propagation delay (picoseconds) and C is the signal to ground capacitance (picofarads/millimeter). The signal to ground capacitance, C, can be determined by the numerical method of W. T. Weeks, above. Substituting yields $$Z_o = 3.33 \sqrt{\epsilon_r}/C,$$

where $Z_o$ is the characteristic impedance, $\epsilon_r$ is the relative dielectric constant of the medium, and C is the electrostatic impedance. Regression analysis of the above relationship for a variety of geometries are reported in C. S. Chang, "Electrical Design of Signal Lines for Multilayer Printed Circuit Boards," *IBM Jnl. of Res. and Dev.*, 33, pp. 647–657 (1988) and C. S. Chang, "Printed Circuit Board Signal Line Electrical Design", in D. P. Seraphim, R. J. Lasky, C. Y. Li, *Principles of Electronic Packaging*, pp. 104–126, both of which are hereby incorporated herein by reference. Based on these regression analyses, the characteristic impedance of the stripline can be expressed as:

$$\sqrt{\epsilon_r}\, Z_o = (1+\delta_{zo}) \times 377/f(w, h_1)$$

where $$f(w, h_1) \approx (w/h_1) + 2.62\, (w/h_1)^{1/4},$$

where w is the width of the signal line, and $h_1$ is the height between the signal line and the reference plane. $(w/h_1)$ is the parallel field contribution, and $(w/h_1)^{1/4}$ is the fringe field contribution to the signal line capacitance. $\delta_{zo}$ is a second order correction factor which may be neglected for a first order approximation. Typically, $\delta_{zo}$ is less then about 3 percent.

These equations have been extended to the case of a triplate, and regression analysis has been performed on the triplate structure. Based on these regression analyses, the characteristic impedance of the triplate can be expressed as:

$$\sqrt{\epsilon_r}\, Z_o = (1+\delta_{zo}) \times 377/f(W, T, H_1)$$

where $$f(W, T, H_1) \approx (W'/H_1) + (W'/H_2) + 2.62\, (W'/H_1)^{1/4},$$

and $$W' = (W+T)/1.5$$

Where W is the width of the signal line, and T is the thickness of the signal line, $H_1$ is the height between the signal line and the reference plane, and W' is the effective width of the signal line. (W'/H$_1$) is the parallel field contribution, and (W'/H$_1$)$^{1/4}$ is the fringe field contribution to the signal line capacitance. $\delta_{zo}$ is a second order correction factor which may be neglected for a first order approximation. Typically, $\delta_{zo}$ is less then about 3 percent.

An active signal on one line induces coupled noise on adjacent, parallel signal lines. There are two design parameters that relate the induced coupled noise:

1. The backward noise on line 2 due to an active signal on line, defined as the backward coupling coefficient, b$_{21}$, and
2. The matched load impedance of signal line 2, Z$_{m12}$.

These can be calculated as follows:

1. Calculate the 3×3 electrostatic capacitance matrix in picofarads per millimeter, using the method of W. T. Weeks, above.
2. Obtain the 3×3 characteristic admittance matrix, $$Y_o = (1/\tau) \, C$$

where $\tau = 3.33 \sqrt{\sqrt{\epsilon_r}}$. (picoseconds/millimeter).

3. When the three signal lines are terminated through three isolated resistors, R$_{L1}$, R$_{L2}$, and R$_{L3}$, to a reference plane, the reflection coefficient, ρ is given by ρ= (Y$_O$+Y$_L$)$^{-1}$ (Y$_O$−Y$_L$), where Y$_L$ is the diagonal matrix of 1/Y$_{Li}$.
4. The above relation is numerically solved, changing the values of R$_{Li}$ until all of the main diagonal elements become zero. The resulting converged set of three resistance is defined as the matched load impedances of the coupled lines, and designated Z$_{ML1}$, Z$_{ML2}$, and Z$_{ML3}$.

This method was used to generate a data base of impedances for a large number of printed circuit board cross sections. Regression analysis of this data base yielded √ε$_r$Z$_o$, √ε$_r$Z$_{ML2}$, and the backward coupling coefficient, b$_{21}$, as a function of the geometric parameters.

These best fit equations, which were solved, and the results stored in the expert system data base, were $$Z_{ML2} = Z_o \times (1-\alpha)$$

where α is linear in (H$_1$/S) and (W/S), and second order in (H$_1$/S), and the cross-talk coupling coefficient, b$_{21}$, is given by $$b_{21} = \log E \times (H_1/S)^F \; mV/V \text{ for } H_1/S > 1.0,$$

and $$b_{21} = M + N \times \exp[1-(H_1/s)] \; mV/V \text{ for } 0.5 < H_1/S < 1.0.$$

E, M, and N are functions of the printed circuit board cross sectional geometry, W/S, H$_1$/H$_2$, T/W, and F is approximately 0.23. These coefficients are determined by regression analysis, and not mechanistically. The results of these regression analyses are part of the expert system data base, and are accessed by directly or indirectly entering the geometric arguments.

The resulting data base, and the above equations, are incorporated into the expert system of the invention. Having stored these values in the expert system data base of out invention, it is unnecessary for the user to repeat the calculations and the regression analysis.

Manufacturing Inference Engine

The inference engine combines the user's design goals and the knowledge base, including the knowledge of the experts and, optionally, knowledge matrices. This enables the user to modify an existing printed circuit board cross section design. The curve fitting algorithm estimates the change required in an input variable in order to change an output variable.

Consider the case of a designer input to simultaneously lower the near end coupled noise (Y1) and the characteristic impedance (Y2) for an unpopulated and/or inactive printed circuit board. Turning to Table II, we see that for the object Y1↓, we need X1↓, X2↓, X3↑, X4↓, and X5↑. Similarly, for the object Y2↓ we need X1↓, X2↓, X3↑, X4↑, and X6↑. Next, the expert system inference engine combines the sets of possible solutions, to find the intersection thereof, that is, Y1↓ & Y2↓=X1↓, X2↓ and X3↑.

If however, the user wishes to reduce the near end coupled noise, Y1↓, while increasing the characteristic impedance, Y2↑, we see that for the object Y1↓, we need X1↓, X2↓, X3↑, X4↓, and X5↑. Similarly, for the object Y2↑ we need X1↑, X2↑, X3↓, X4↓, and X6↓. Next, the expert system inference engine combines the sets of possible solutions, to find the intersection thereof, that is, Y1↓ & Y2↑=X4↓. This solution states that decreasing the signal line thickness, h, (represented by X4) reduces the saturated near-end coupled noise while increasing the characteristic impedance of the signal line.

STRUCTURE OF THE MANUFACTURABILITY EXPERT SYSTEM

Figure 9:
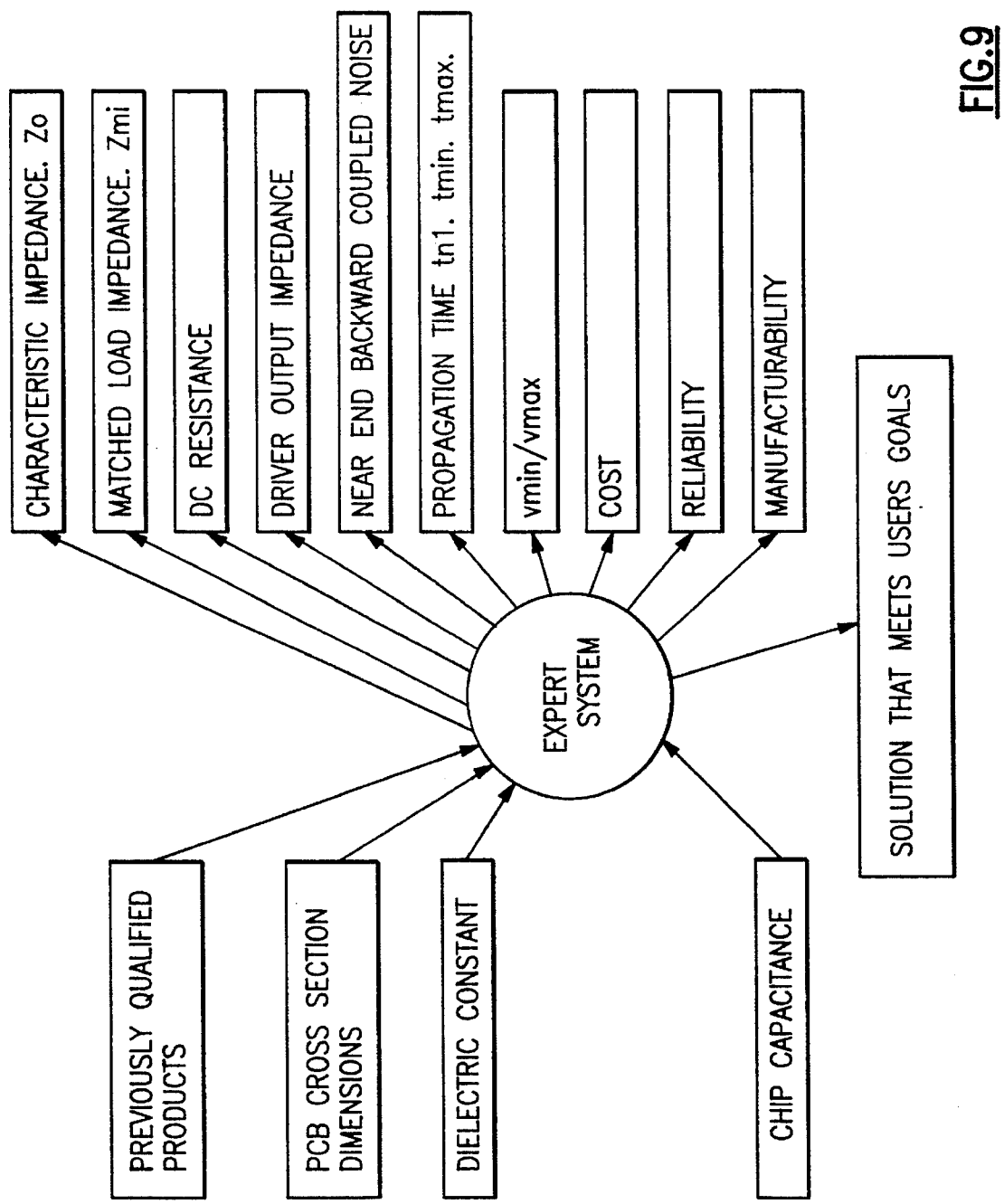
FIG. 9 shows the tool of the invention as presented to a user carrying out the method of the invention, with the inputs entered by the user and the outputs provided by the tool.

The manufacturability expert system, which is a concurrent design engineering tool, has the structure shown in FIG. 9. The I/O management provides the user's design inputs and the design goals to the curve fitting algorithm. The curve fitting algorithm in turn computes the electrical parameters of the printed circuit board cross section. The inference engine receives the design goals, the (knowledge data base) rules of thumb, and the knowledge data base knowledge matrices. In a further embodiment of the invention the expert system inference engine gives instructions to the curve fitting algorithm for solving the stated design goals.

Figure 8:
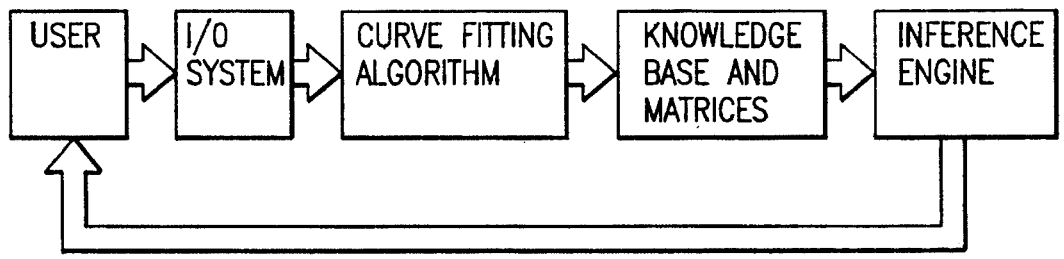
FIG. 8 illustrates the four components of the Expert System tool of the invention, (1) an input/output management or I/O system, (2) the curve fitting algorithm that calculates the electrical parameters of the printed circuit board cross section, (3) knowledge matrices representing the relationships between the inputs and the outputs, and (4) the inferencing engine.
Figure 12:
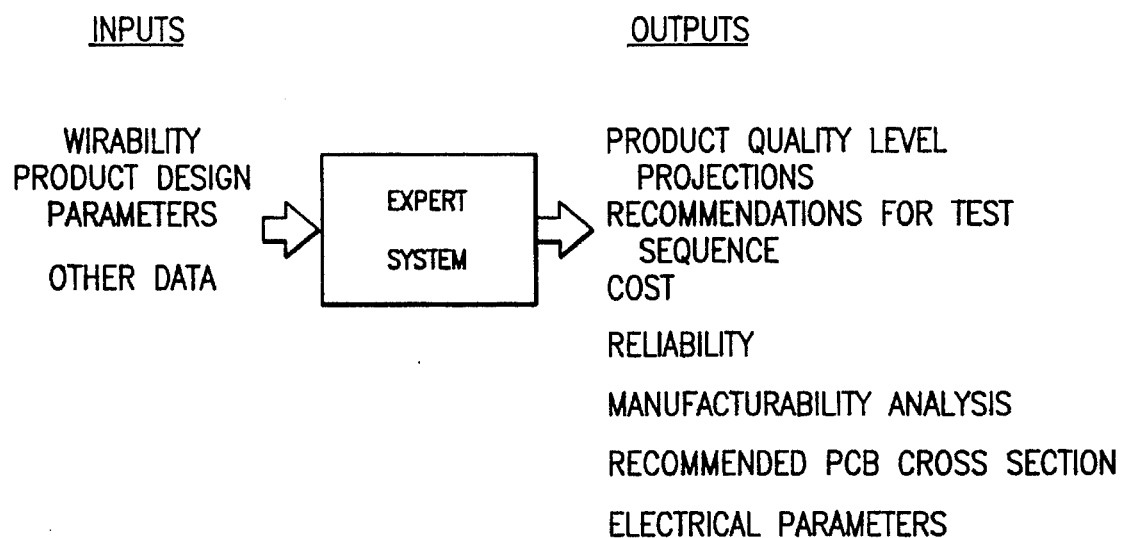
FIG. 12 is a high level Input/Process/Output diagram of the test sequence portion of the method and tool of the invention.

Turning now to FIG. 8, the operations of the expert system are shown. After start, the first block is the I/O block (1), where the user enters the inputs and outputs to the expert system. The I/O system includes I/O panels, for example Graphical User Interfaces, as well as data bases of qualified printed circuit board designs, and of chip parameters. The expert system starts with the user inputs and the qualified design and chip parameter databases. Using these inputs, the expert system computes and displays the results in the output space. The output can be selected, e.g., by toggling, or by a menu, or even by a simulation tool, for the various degree of chip capacitive loading. The user can retrieve previously qualified printed circuit board information and chip information from the data bases, as the basis for new designs. It is, of course, to be understood that on-line helps are also available to give a user information, and to guide the user through the expert system user interface. The user can modify the design only when the "New Design" or "Modify Design" tools are active.

The Menu function presents the menu to the user after the results for a new design have been obtained. The choices open to the user include one or more of the functions "Modify Design," "Define Goals," "New Design," "View Change," "Draw Design," "Design Comparison," "Print Result," and "Quit" among others.

The New Design is the first operation that the Expert System of the invention performs when activated. In the New Design operation the user enters the value of each input variable into the input panel and obtains complete results in the output panel. After completion of the New Design function, the user can call up the Menu.

In the Define Goals function the user defines the design goals, that is, the customer requirements. Defining user goals or customer requirements includes modification of an exiting design. By way of exemplification, the goal for the near end coupled noise can be 120 mV/V, and the ratio between $V_{min}/V_{max}$ can be defined to be 0.80. After defining these goals the user can re-access the Menu.

In the Modify Design function (6), the inferencing engine is activated. In the Modify Design function (6) the user first specifies which output variables are to be increased and which output variables are to be decreased. The inferencing engine first checks for conflicting goals, and interact the presence or absence of conflicting goals back to user. After resolving conflicting goals, the user asks the expert system of the invention to proceed. The expert system then can either change the inputs or direct the user to change certain inputs to bring the design closer to the user's goals and the customer's specifications. Thus, when the user inputs the goals of decreasing the coupled noise to below 120 mV/V, and increasing $V_{min}/V_{max}$ to 0.8, the output responds, when in the interactive mode, by suggesting to the user which variables to increase, and which variables to decrease. In the non-interactive mode, the expert system changes these variables, and includes them in the solution set presented to the user.

If the user decides to go forward with the design process, the curve fitting algorithm receives the then existing user inputs, the goals, and the directions of changes. The curve fitting algorithm then computes the sets of variables required for the user set inputs to meet the design requirements. In this regard, if, for example, the user were to increase the line to line spacing, the resulting modified design would still meet the user design inputs of the coupled noise being below 120 mV/V, and the ratio of $V_{min}/V_{max}$ being above 0.8.

The View Changes function shows the changes in inputs and outputs between two consecutive designs.

The Draw Design function shows the design graphically on the screen.

The Design Comparison function allows the user to compare a set or subset of design, for example by comparing the effect of changing hl/w, w/s, or chip capacitance on the user input parameters. This is the "what if" output.

The Print Results function prints out the I/O panel to an output device

The Quit function exits the expert system. One aspect of the output functions and the Quit function is to save the candidate designs in a format that allows them to be an input to the point to point wiring CAD program.

Forward Mode Operation of the Inference Engine

In the forward mode operation mode, the design engineer enters the design parameters, and the tool reacts as described above. In one embodiment the tool displays a graphic cross section of the printed circuit board. Also displayed are the parameters that can effect electrical performance, e.g., the electrical properties, such as line widths, line spacings, line thicknesses, number of laminations, and types of laminations. Other variables may also be available, e.g., through a data box. The forward mode operation of the inference engine displays the resulting electrical parameters, the overall thicknesses, etc. Changing any parameter causes recalculation of the electrical and dimensional quantities, invoking the forward chaining inference engine and its associated data bases and rule bases.

If enough detail is specified, cost, manufacturability, and reliability projections are specified.

The forward mode operation of the inference engine provides either or both a display or a printout of the cross section and the design parameters.

Backward Mode Operation of the Inference Engine

In backward mode operation Of the inference engine the designer specifies the required electrical performance and the wirability targets. The tool then searches the appropriate databases to find all of the design solutions that meet these requirements. The solution set, which can be quite large, includes both previously qualified cross section designs drawn from the data base and new, unqualified designs created by the tool and method of the invention.

POST DESIGN QUALITY CONTROL ANALYSIS

The set of designs, or a subset thereof, can be subjected to a quality management subsystem of the process and tool of the invention. The total management quality aspects of the invention provides a test plan that will meet the customer's quality objectives.

In a preferred embodiment of this aspect of the invention, a test development plan is prepared for each PCB in a system, with a defined product quality level for each such card or board. The test development plan includes the in-process test development plan for each printed circuit board and card in order to achieve the specified product quality level.

By a test development plan is meant a sequence of tests to be accomplished at each build level, i.e., at each power core, signal core, composite, and assembly level of fabrication. The tests include optical tests, low voltage electrical tests, e.g., for shorts and opens, and high voltage electrical tests, e.g., for high voltage leakage. The test development plan includes the tests and test sequences that will quickly detect the defects. These tests are designed to detect and screen out various types of defects, such as opens, shorts, spacing violations, and line widthg reductions. The specific sequence of tests applied across the build levels is referred to as a test matrix. Because there are many tests and test sequences, there are many possible test matrices. In this regard, each specific test tool has an inherent efficiency in detecting certain defects at certain levels. Thus, each possible sequence has a certain inherent efficiency in detecting sets of defects. The tool and method of the invention finds the test matrix which provides the required quality by screening out defects at the least possible cost.

The tool and method of the test development embodiment of the invention is based on the accumulated heuristic knowledge and experience of recognized authorities in the fields of test, product quality levels, and reliability.

Figure 13:
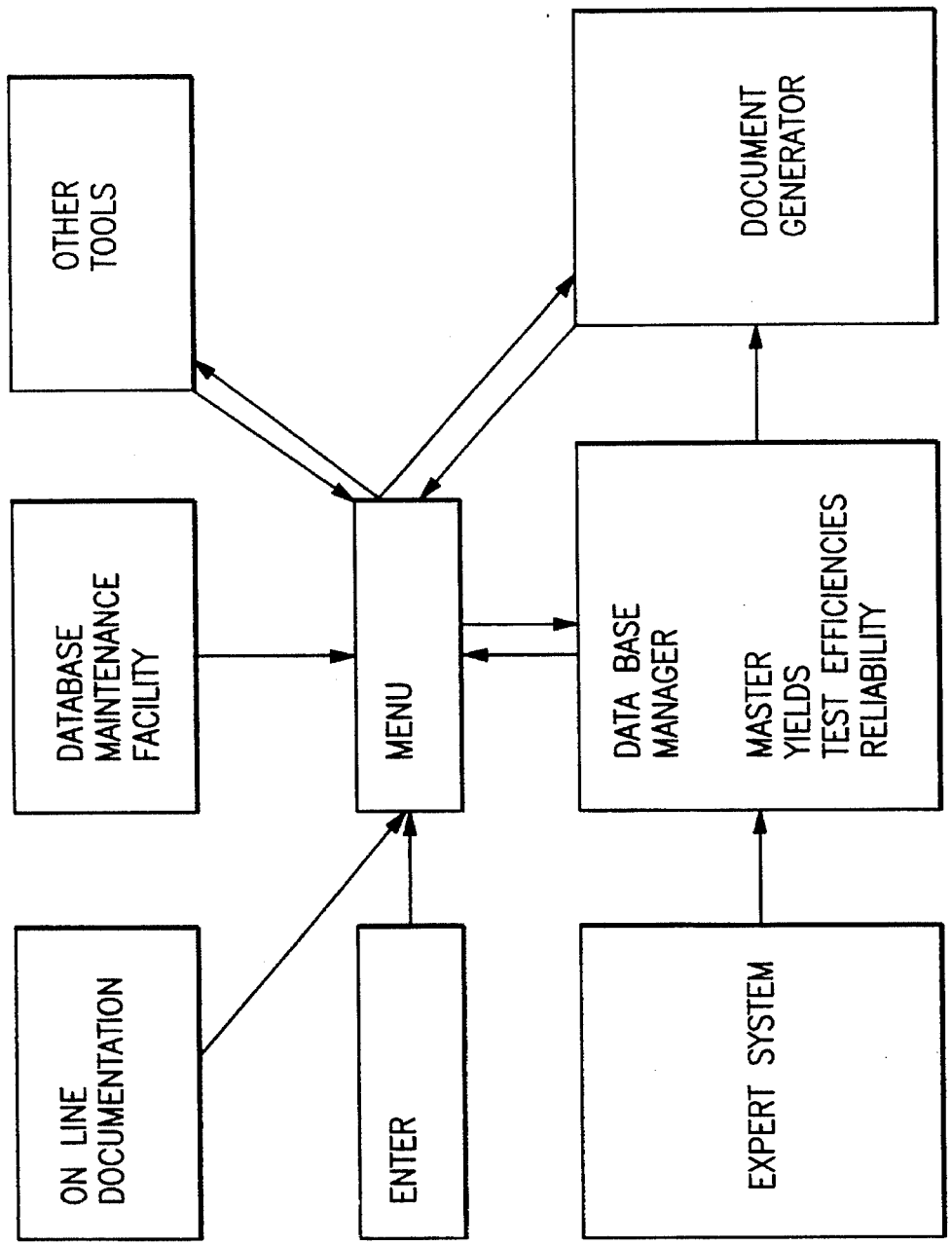
FIG. 13 illustrates the information flow of the test sequence portion of the method and tool of the invention.

The tool and method of this embodiment of the invention blends an expert system with a database manager and a document generator in a single menu-driven system. This is shown in FIG. 13. The expert system element draws upon the design output of the printed circuit board cross section tool of the invention, and recommends the best test plan for the printed circuit board cross section. Inputs to the tool and method of the invention include the customer's product quality level and reliability targets, the product design, and related information from the knowledge and heuristic data bases. The tool and method of the invention computes the product quality level and the reliability projections for each test plan. The reliability projections of the test plans are compared with the customer's requirements, the product designs parameters are reconciled with the testability constraints of each test plan (because not every printed circuit board is testable with every tester). This information is correlated with test rules to make a final test plan.

During its execution stage the method and tool retrieves from its data bases additional information about process yields, tester efficiencies, algorithm constraints, and other factors needed to make a test recommendation.

In one embodiment of the invention the test development system is a VP-Expert based system that interfaces to dBase data bases. The system is built around the expert system—database manager—document generator path. The menu can invoke the on-line documentation, the database maintenance facility, and any member of the expert system—database manager—document generator system.

The method and tool of the invention allows the printed circuit board design engineer to go from a set of user requirements, including quality requirements, to a cross section design input to a test matrix tool and a point to point to point wiring CAD tool, and to then develop a test development plan and a wiring plan.

While the invention has been described with respect to certain preferred embodiments and exemplifications, it is not intended to limit the scope of the invention thereby, but solely by the claims appended hereto.

We claim:

1. An article of manufacture comprising a computer usable medium having computer readable program code means embodied therein for generating cross section designs and build up test sequences for a multi-layer printed circuit board, and having a computer readable input/output means, a computer readable knowledge base means, and a computer readable inference engine means, said computer readable knowledge base means comprising (i) computer readable regression analysis data base means relating transmission line parameters to printed circuit board geometric parameters, and (ii) computer readable "IF . . . THEN . . . " production rules for lamination, registration, circuitization, testability, and test methodologies, for manufacturability, cost, test development, second level packaging and printed circuit board cross sectional design, said computer readable input/output means, computer readable knowledge base means, and said computer readable inference engine means being capable of working together to carry out the steps of:

a. receiving the printed circuit board design parameters and performance parameters through the computer readable input/output means; and b. applying, in the computer readable inference engine means, the computer readable knowledge base production rules and the computer readable geometric parameter to transmission line parameter data base means to the computer readable printed circuit board design and performance parameters to generate a set of cross section designs meeting the user specified performance parameters.

2. A computer program product for generating printed circuit board cross section designs and build up test sequences, said computer program product having computer readable program code input/output means, computer readable program code knowledge base means, and computer readable program code inference engine means, said computer readable program code knowledge base means comprising (i) regression analysis derived printed circuit board parameter to transmission line parameter data base means, and (ii) "IF . . . THEN . . . " production rules for lamination, registration, circuitization, testability, test tools, and test methodologies, for manufacturability, cost, test development, second level packaging and printed circuit board design, said computer readable program code input/output means, computer readable program code knowledge base means, and said computer readable program code inference engine means being capable of working together to carry out the steps of:

a. entering through the computer readable program code input/output means
   (1). printed circuit board design parameters chosen from the group consisting of one or more of application and population of the printed circuit board, the number of holes, vias, layers, signal planes, power planes, and ground planes, and the wiring grid limits; and
   (2) printed circuit board testability, test tools, and test procedures; and
   (3). printed circuit board performance parameters chosen from the group consisting of one or more of noise, cross-talk, characteristic impedance, matched load impedance, direct current resistance, signal propagation time, and difference mode performance parameters;

b. applying, in the computer program code inference engine means, the knowledge base geometric parameters to transmission line parameters data base and the production rules to the printed circuit board design and performance parameters to generate a set of cross section designs meeting the user specified performance parameters; and c. applying, in the computer readable program code inference engine means, the knowledge base production rules for testability, test tools, and test procedures, for test development to the set of cross section designs to thereby generate a build up test sequence.

* * * * *